United States Patent
Jeon (10) Patent No.: US 9,496,319 B2
(45) Date of Patent: Nov. 15, 2016

(54) PIXEL CIRCUIT AND DISPLAY APPARATUS INCLUDING THE SAME

(71) Applicant: Samsung Display Co., Ltd., Yongin (KR)

(72) Inventor: Jae Hyeon Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/668,105

(22) Filed: Mar. 25, 2015

(65) Prior Publication Data
US 2016/0079317 A1    Mar. 17, 2016

(30) Foreign Application Priority Data
Sep. 15, 2014  (KR) .......................... 10-2014-0122136

(51) Int. Cl.
*H01L 27/32*    (2006.01)
(52) U.S. Cl.
CPC ....... *H01L 27/3225* (2013.01); *H01L 27/3262* (2013.01)
(58) Field of Classification Search
CPC .......................... H01L 27/3262; H01L 27/3225
USPC ........ 345/76, 204, 87, 92, 97; 349/143, 148, 349/161, 199, 37, 42
See application file for complete search history.

(56) References Cited

U.S. PATENT DOCUMENTS

| | | | | |
|---|---|---|---|---|
| 6,326,944 | B1 * | 12/2001 | MacLean | G09G 3/344 345/106 |
| 2004/0041761 | A1 * | 3/2004 | Sugita | G09G 3/3648 345/87 |
| 2004/0239661 | A1 * | 12/2004 | Jo | G09G 3/3241 345/204 |
| 2005/0156833 | A1 * | 7/2005 | Koyama | G09G 3/3241 345/76 |

FOREIGN PATENT DOCUMENTS

| | | |
|---|---|---|
| JP | 2001-337613 | 12/2001 |
| KR | 10-2005-0049686 | 5/2005 |
| KR | 10-2005-0049691 | 5/2005 |
| KR | 10-2014-0039443 | 4/2014 |

* cited by examiner

*Primary Examiner* — Alexander H Taningco
*Assistant Examiner* — Renan Luque
(74) *Attorney, Agent, or Firm* — H.C. Park & Associates, PLC (57) ABSTRACT

A display apparatus including: a display unit including a plurality of pixels, each of the plurality of pixels including: a light-emitting circuit including a light-emitting device; and a heating circuit adjacent to the light-emitting circuit, the heating circuit including: a heating device; and a controller configured to generate and output an emission signal for controlling an operation of the light-emitting circuit; and generating and output a heating signal for controlling an operation of the heating circuit, wherein: a first end of the light-emitting circuit is connected to a first power supply voltage; a second end of the light-emitting circuit is connected to a second power supply voltage; a first end of the heating circuit is connected to a first heating power supply voltage; and a second end of the heating circuit is connected to a second heating power supply voltage.

19 Claims, 5 Drawing Sheets

PIXEL CIRCUIT AND DISPLAY APPARATUS INCLUDING THE SAME

CROSS REFERENCE TO REPLATED APPLICATION

This application claims priority from and the benefit of Korean Patent Application No. 10-2014-0122136, filed on Sep. 15, 2014, which is hereby incorporated by reference for all purposes as if fully set forth herein.

BACKGROUND

1. Field

Exemplary embodiments relate to a pixel circuit configured to prevent dew condensation and a display apparatus including the pixel circuit.

2. Discussion of the Background

Display devices have been rapidly widespread since the commencement of the "information technology era." Display devices may have characteristics, such as light weight, thinness, and low power consumption, which increasingly expanded the range of the application of display devices. Recently, large-scale display devices have been developed for purpose of providing screens or displaying advertisements in an outdoor environment. However, large-scale display devices may often suffer from condensation due to, for example, difference of temperature during the day and the night when used in an outdoor environment. Condensation may leave water stains and/or cause contamination, deteriorating the quality of display apparatus. Also, eliminating condensation is typically achieved via additional process, such as wiping off using a dry cloth, which would be inconvenient.

To address these problems associated with condensation, various methods have been suggested to prevent the occurrence of condensation on a display apparatus. One of the methods involves installing hot wires at the rear of the display panel of a display apparatus. However, the installation of additional elements, such as hot wires at the rear of a display panel, not only complicates the manufacture of a display apparatus, but also increases the manufacturing cost of a display apparatus. Also, hot wires may not be applicable to flexible display apparatuses.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a pixel circuit, which includes a heating unit for removing or reducing condensation.

Exemplary embodiments also provide a display apparatus including a pixel circuit, which includes a heating unit for removing or reducing condensation.

Additional aspects will be set forth in the detailed description which follows, and, in part, will be apparent from the disclosure, or may be learned by practice of the inventive concept.

An exemplary embodiment discloses a display apparatus including: a display unit including a plurality of pixels, each of the plurality of pixels including: a light-emitting circuit including a light-emitting device; and a heating circuit adjacent to the light-emitting circuit, the heating circuit including: a heating device; and a controller configured to generate and output an emission signal for controlling an operation of the light-emitting circuit; and generating and output a heating signal for controlling an operation of the heating circuit, wherein: a first end of the light-emitting circuit is connected to a first power supply voltage; a second end of the light-emitting circuit is connected to a second power supply voltage; a first end of the heating circuit is connected to a first heating power supply voltage; and a second end of the heating circuit is connected to a second heating power supply voltage.

An exemplary embodiment also discloses a pixel circuit including: a light-emitting unit including a light-emitting device configured to emit light in response to an emission signal; and a heating unit adjacent to the light-emitting unit, the heating unit being configured to generate heat in response to a heating signal, wherein: the emission signal includes a low-level emission signal and a high-level emission signal; the heating signal includes a low-level heating signal and a high-level heating signal; and an application time of the low-level emission signal differs from an application time of the low-level heating signal.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to plan and/or sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
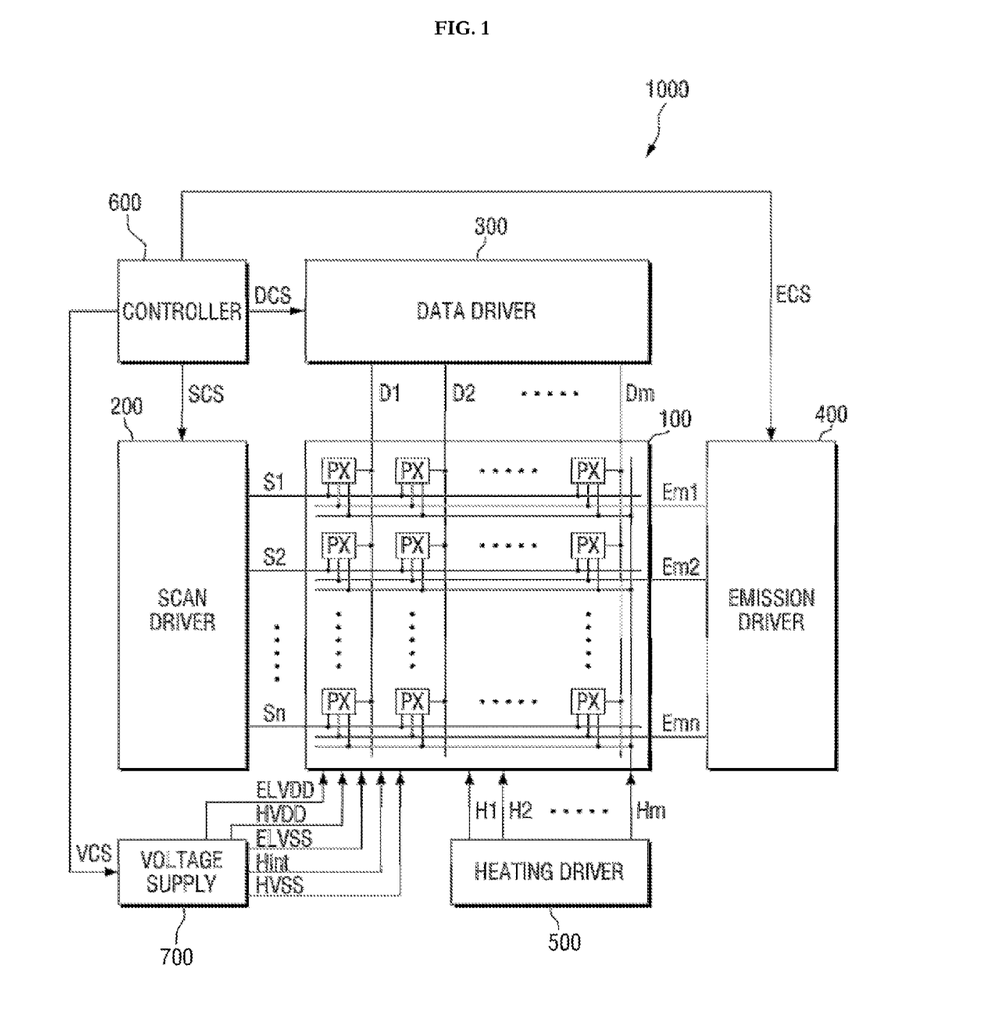
FIG. 1 is a block diagram of a display apparatus, according to exemplary embodiments.

FIG. 1 is a block diagram of a display apparatus, according to exemplary embodiments.

Referring to FIG. 1, a display apparatus 1000 may include a display unit 100, a scan driver 200, an emission driver 400, a heating driver 500, a controller 600, and a voltage supply 700.

The display unit 100 may include a plurality of pixels PX, which are disposed at the intersections of a plurality of scan lines including a first through an n-th scan lines S1, S2, . . . , Sn and a plurality of data lines including a first through an m-th data lines D1, D2, . . . , Dm. The plurality of pixels PX may be arranged in a matrix. Each of the plurality of pixels PX may include an organic light-emitting unit (not illustrated), which is configured to emit one of a red light, a green light, or a blue light, and a heating unit (not illustrated), which is configured to generate heat for a predetermined amount of time to prevent or reduce condensation. The organic light-emitting unit and the heating unit will be described later in further detail.

The emission of light from the plurality of pixels PX may be controlled by applying signals to the plurality of scan lines S1, S2, . . . , Sn, the plurality of data lines D1, D2, . . . , Dm, and a plurality of emission lines including a first through an n-th emission lines EM1, EM2, . . . , EMn, which are provided in the display unit 100, in accordance with a scan driving control signal SCS, a data driving control signal DCS, and an emission driving control signal ECS, respectively, which are provided by the controller 600.

The generation of heat in the plurality of pixels PX may be controlled by applying signals to a plurality of heating lines including a first through an m-th heating lines H1, H2, . . . , Hm, which are also provided in the display unit 100, in accordance with a heating driving control signal HCS, which is provided by the controller 600. A control operation for generating heat in the plurality of pixels PX may have timing opposite to a control operation for emitting light from the plurality of pixels PX. That is, when a low-level signal is applied to the plurality of heating lines H1, H2, . . . , Hm, the plurality of scan lines S1, S2, . . . , Sn and the plurality of emission lines EM1, EM2, . . . , EMn may be disabled, or applied with a high-level signal. The plurality of scan lines S1, S2, . . . , Sn and the plurality of emission lines EM1, EM2, . . . , EMn may also be in floating status during which no signal is applied thereto.

The scan driver 200 may apply a signal to one of the plurality of scan lines S1, S2, . . . , Sn connected to a predetermined pixel PX in response to receiving the scan driving control signal SCS from the controller 600.

The data driver 300 may apply a signal to one of the plurality of data lines D1, D2, . . . , Dm connected to the predetermined pixel PX in response to receiving the data driving control signal DCS from the controller 600.

The emission driver 400 may apply a signal to one of the plurality of emission lines EM1, EM2, . . . , EMn connected to the predetermined pixel PX in response to receiving the emission driving control signal ECS from the controller 600.

The heating driver 500 may apply a signal to one of the plurality of heating lines H1, H2, . . . , Hm connected to the predetermined pixel PX in response to receiving the heating driving control signal HCS from the controller 600.

The controller 600 may receive image data and generate various control signals (e.g., the scan driving control signal SCS, the data driving control signal DCS, and the emission driving control signal ECS) for controlling the operations of the scan driver 200, the data driver 300, and the emission driver 400 so that the display unit 100 may display the received image data. The scan driving control signal SCS may control whether each of the plurality of pixels PX to receive the data signals applied thereto via the plurality of data lines D1, D2, . . . , Dm. The data driving control signal DCS may include luminance information relating to the luminance of each of the plurality of pixels PX. The emission driving control signal ECS may control the plurality of pixels PX to emit light.

The controller 600 may generate the heating driving control signal HCS for controlling the heating driver 500 to generate heat in the plurality of pixels PX for a predetermined amount of time when no image data is received and prevent or reduce condensation.

The controller 600 may generate a voltage supply control signal VCS, which is for controlling the voltage supply 700 to generate and supply power to the display unit 100 that corresponds to the timing of the light emission from the plurality of pixels PX and the timing of the heat generation in the plurality of pixels PX, respectively.

The voltage supply 700 may receive the voltage supply control signal VCS from the controller 600, generate a first power supply voltage ELVDD, a second power supply voltage ELVSS, a first heating power supply voltage HVDD, a second heating power supply voltage HVSS, and an initial heating voltage Hint, and supply the first power supply voltage ELVDD, the second power supply voltage ELVSS, the first heating power supply voltage HVDD, the second heating power supply voltage HVSS, and the initial heating voltage Hint to the display unit 100 according to the timing of the light emission from the plurality of pixels PX or the timing of the heat generation in the plurality of pixels PX.

In exemplary embodiments, the scan driver 200, the data driver 300, the emission driver 400, the heating driver 500, the controller 600, the voltage supply 700, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the scan driver 200, the data driver 300, the emission driver 400, the heating driver 500, the controller 600, the voltage supply 700, and/or one or more components thereof may include or otherwise be associated with one or more memories (not shown) including code (e.g., instructions) configured to cause the scan driver 200, the data driver 300, the emission driver 400, the heating driver 500, the controller 600, the voltage supply 700, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 2:
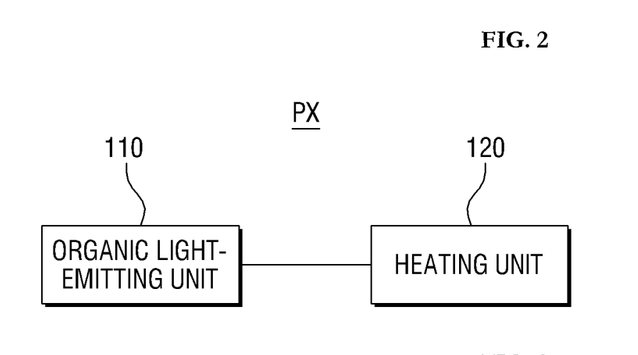
FIG. 2 is a block diagram of a pixel, according to exemplary embodiments.
Figure 3:
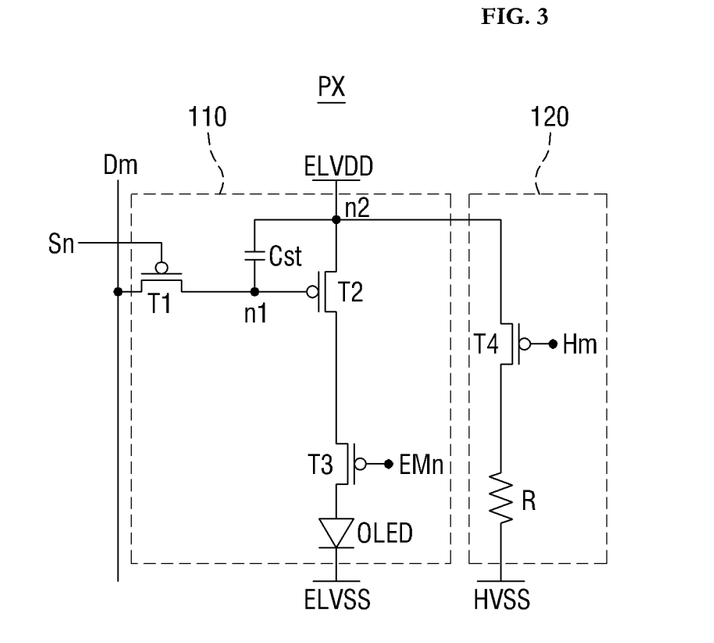
FIG. 3 is a circuit diagram of the pixel illustrated in FIG. 2, according to exemplary embodiments.

FIG. 2 is a block diagram of a pixel, according to exemplary embodiments, and FIG. 3 is a circuit diagram of the pixel illustrated in FIG. 2, according to exemplary embodiments, connected to a scan line Sn, a heating line Hm, and an emission line EMn.

Referring to FIG. 2, a pixel PX may include an organic light-emitting unit 110 and a heating unit 120. Referring to FIG. 3, the organic light-emitting unit 110 may include a plurality of thin film transistors (TFTs), which are connected to a plurality of signal lines to receive a plurality of signals, a storage capacitor Cst, and an organic light-emitting device OLED. The plurality of TFTs may include a first TFT T1, a second TFT T2, and a third TFT T3.

The plurality of signals may include a selection signal applied to a scan line Sn, a data signal applied to a data line Dm, and an emission signal applied to an emission line EMn.

The gate terminal of the first TFT T1 may receive the selection signal from the scan line Sn. The source terminal of the first TFT T1 may receive the data signal from the data line Dm. The drain terminal of the first TFT T1 may be connected to a first node n1. The first TFT T1 may be turned on in response to the selection signal, and may perform a switching operation to transmit the data signal from the data line Dm to the storage capacitor Cst, which is connected to the first node n1.

The gate terminal of the second TFT T2 may be connected to the first node n1. The source terminal of the second TFT T2 may be connected to the first power supply voltage ELVDD via the second node n2. The drain terminal of the second TFT T2 may be connected to the anode of the organic light-emitting device OLED via the third TFT T3. As a result of the switching operation performed by the first TFT T1, the second TFT T2 may receive the data signal from the storage capacitor Cst, and may apply a driving current to the organic light-emitting device OLED.

The gate terminal of the third TFT T3 may receive the emission signal from the emission line EMn. The source terminal of the third TFT T3 may be connected to the drain terminal of the second TFT T2. The drain terminal of the third TFT T3 may be connected to the anode of the organic light-emitting device OLED. The third TFT T3 may be turned on in response to the emission signal, and the first power supply voltage ELVDD may be applied to the organic light-emitting device OLED so that the organic light-emitting device OLED may emit light.

A first end of the storage capacitor Cst may be connected to the first node n1, and a second end of the storage capacitor Cst may be connected to a second node n2. The storage capacitor Cst may be charged with a data voltage applied to the gate terminal of the second TFT T2, and may maintain the data voltage while the first TFT T1 is turned off.

The organic light-emitting device OLED may be an organic light-emitting diode (OLED). The organic light-emitting device OLED may include the anode connected to the drain terminal of the second TFT T2, and a cathode connected to the second power supply voltage ELVSS. The organic light-emitting device OLED may receive a driving current from the second TFT T2, and may thus emit light. As a result, an image may be displayed.

The heating unit 120 may be disposed near the organic light-emitting unit 110, as illustrated in FIG. 3. The heating unit 120 may include a fourth TFT T4 and a heating resistor R. The heating unit 120 may use the heating resistor R to generate heat, but the invention is not limited thereto. That is, the heating unit 120 may use various heating devices other than the heating resistor R.

The gate terminal of the fourth TFT T4 may receive a heating signal from the heating line Hm. The source terminal of the fourth TFT T4 may be connected to a first end of the second node n2. The drain terminal of the fourth TFT T4 may be connected to the heating resistor R. The fourth TFT T4 may be turned on in response to the heating signal, and the first power supply voltage ELVDD may be applied to the heating resistor R via the second node n2. As a result, the heating resistor R may generate heat from the voltage difference between the first power source voltage ELVDD and the second heating power supply voltage HVSS. The second heating power supply voltage HVSS may be lower than the second power supply voltage ELVSS.

The first end of the heating resistor R may be connected to the drain terminal of the fourth TFT T4, and a second end of the heating resistor R may be connected to the second heating power supply voltage HVSS. The heating resistor R may generate heat from the voltage difference between the first power supply voltage ELVDD and the second heating power supply voltage HVSS, and prevent or reduce condensation on the display apparatus 100.

The pixel circuit according to an exemplary embodiment is not limited to the exemplary embodiment illustrated in FIG. 3, and may have other structures.

Figure 4:
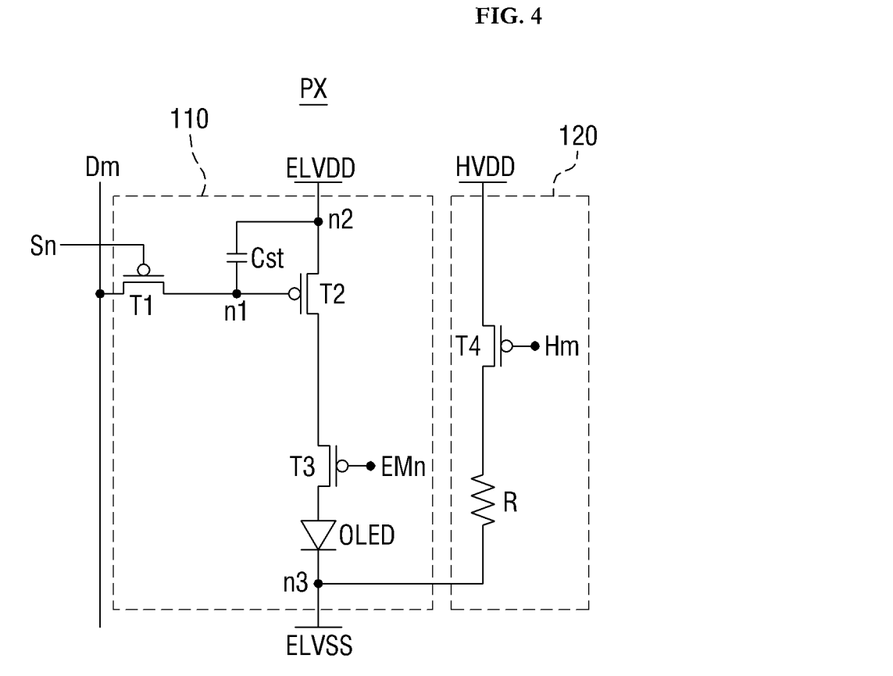
FIG. 4 is a circuit diagram of the pixel of FIG. 2, according to exemplary embodiments.

FIG. 4 is a circuit diagram of the pixel of FIG. 2, according to exemplary embodiments, connected to the scan line Sn, the heating line Hm, and the emission line EMn. The pixel PX of FIG. 4 has almost the same structure as the pixel PX of FIG. 3 except for the configuration of a heating unit 120 thereof, and thus, a detailed description of an organic light-emitting unit 110 of the pixel PX of FIG. 4 will be omitted.

Referring to FIG. 4, the gate terminal of a fourth TFT T4 of the heating unit 120 may receive a heating signal from a heating line Hm. The source terminal of the fourth TFT T4 may be connected to a first heating power supply voltage HVDD. The drain terminal of the fourth TFT T4 may be connected to a first end of a heating resistor R. The fourth TFT T4 may be turned on in response to the heating signal, and the first heating power supply voltage HVDD may be applied to the heating resistor R. As a result, the heating resistor R may generate heat from the voltage difference between the first heating power supply voltage HVDD and a second power supply voltage ELVSS. The first heating power supply voltage HVDD may be higher than a second power supply voltage ELVSS.

The first end of the heating resistor R may be connected to the drain terminal of the fourth TFT T4, and a second end of the heating resistor R may be connected to a third node n3. The heating resistor R may be connected to the second power supply voltage ELVSS via the third node n3. Accordingly, the heating resistor R may generate heat from the voltage difference between the second heating power supply voltage HVSS and the second power supply voltage ELVSS, and may thus prevent condensation on the display apparatus 100.

A driving method of the pixel PX of FIG. 3 or 4 will hereinafter be described with reference to FIG. 5.

Figure 5:
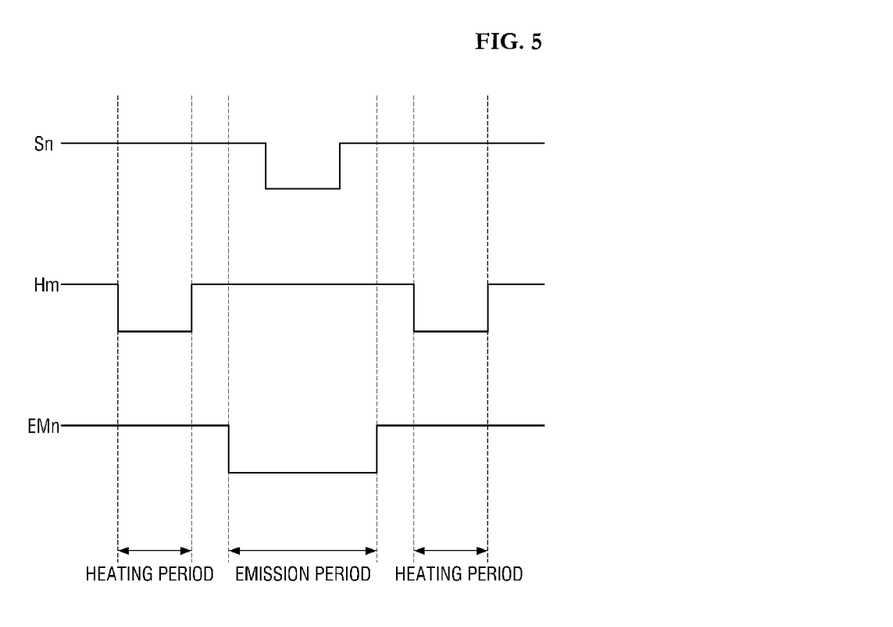
FIG. 5 is a timing diagram illustrating variations in the level of each signal applied to a pixel, according to exemplary embodiments.

FIG. 5 is a timing diagram illustrating variations in the level of each signal applied to a pixel from the scan line Sn, the heating line Hm, and the emission line EMn, according to exemplary embodiments. Referring to FIG. 5, the first TFT T1 may be turned on in response to a selection signal, for example, a low-level selection signal, applied from the scan line Sn, and may transmit a data signal applied from the data line DM to the storage capacitor Cst. A high-level heating signal is applied from the heating line Hm, and the fourth TFT T4 may be turned off. A low-level emission signal is applied from the emission line EMn, turning on the third TFT T3 before the low-level selection signal is applied from the scan line Sn. The data signal stored in the storage capacitor Cst may turn on the second TFT T2, and as a result, a driving current may be transmitted to the organic light-emitting device OLED via the third TFT T3 so that the organic light-emitting device OLED may emit light. This time period may be referred to as an emission period.

After the emission period, a high-level selection signal may be applied from the scan line Sn, and a high-level emission signal may be applied from the emission line EMn. As a result, the third TFT T3 may be turned off. Then, in response to a heating signal, for example, a low-level heating signal, applied from the heating line Hm, the fourth TFT T4 may be turned on. As a result, the heating resistor R may generate heat from the voltage difference between the first power supply voltage ELVDD and the second heating power supply voltage HVSS. This time period may be referred to as a heating period.

The pixel PX illustrated in the FIG. 4 may have almost the same emission period and heating period of the pixel PX of FIG. 3, except for that the heating resistor R may generate heat from the voltage difference between the first heating power supply voltage HVDD and the second power supply voltage ELVSS.

Figure 6:
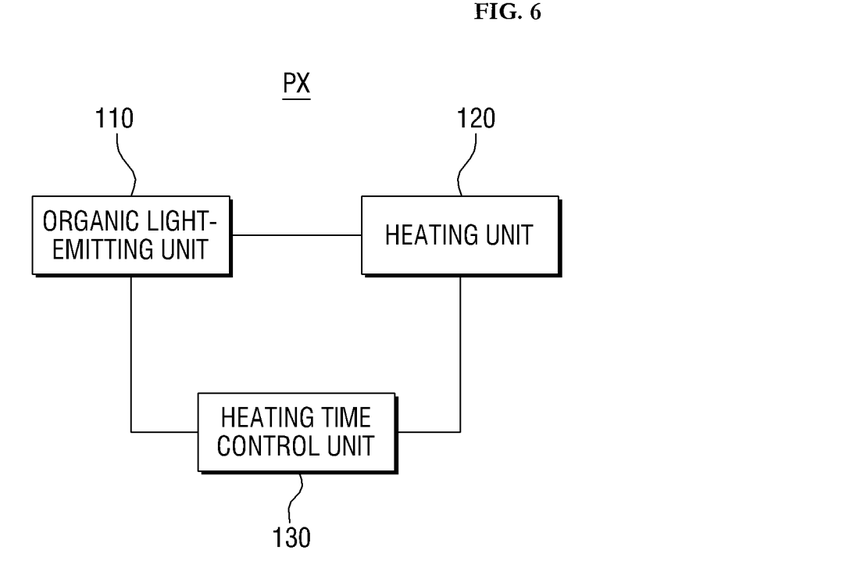
FIG. 6 is a block diagram of a pixel, according to exemplary embodiments.
Figure 7:
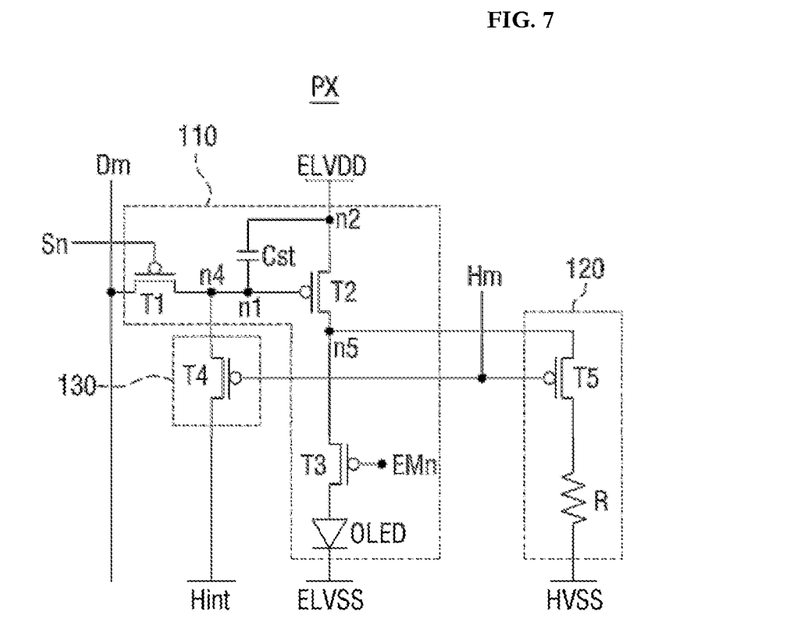
FIG. 7 is a circuit diagram of the pixel of FIG. 6, according to exemplary embodiments.

FIG. 6 is a block diagram of a pixel, according to exemplary embodiments, and FIG. 7 is a circuit diagram of the pixel of FIG. 6, according to exemplary embodiments.

Referring to FIG. 6, a pixel PX may include an organic light-emitting unit 110, a heating unit 120 and a heating time control unit 130. The pixel PX of FIG. 7 has almost the same structure as the pixel PX of FIG. 3 except for the heating unit 120 and the heating time control unit 130 thereof, and thus, a detailed description of the organic light-emitting unit 110 of the pixel PX of FIG. 4 will be omitted.

Referring to FIG. 7, the heating unit 120 may include a fifth TFT T5, and the heating time control unit 130 may include a fourth TFT T4. A gate terminal of the fifth transistor T5 of the heating unit 120 may be connected to a gate terminal of the fourth TFT T4 of the heating time control unit 130, and may receive a heating signal from a heating line Hm. The source terminal of the fifth TFT T5 may be connected to a fifth node n5, and the first power supply voltage ELVDD may be applied to the source terminal of the fifth TFT T5 via the fifth node n5. The drain terminal of the fifth TFT T5 may be connected to a first end of a heating resistor R. The fifth TFT T5 may be turned on in response to the heating signal, and the first power supply voltage ELVDD may be applied to the heating resistor R via a second TFT T2. As a result, the heating resistor R may generate heat from the voltage difference between the first power supply voltage ELVDD and a second heating power supply voltage HVSS. The second heating power supply voltage HVSS may be lower than the first power supply voltage ELVDD.

The first end of the heating resistor R may be connected to the drain terminal of the fifth TFT T5, and a second end of the heating resistor R may be connected to the second heating power supply voltage HVSS. Accordingly, the heating resistor R may generate heat from the voltage difference between the first power supply voltage ELVDDD and the second heating power supply voltage HVSS, and thus prevent or reduce condensation on the display apparatus 100.

The gate terminal of the fourth TFT T4 may be connected to the gate terminal of the fifth TFT T5, and may receive the heating signal from the heating line Hm. The source terminal of the fourth TFT T4 may receive an initial heating voltage Hint, and the drain terminal of the fourth TFT T4 may be connected to a fourth node n4. The fourth TFT T4 may be turned on in response to receipt of the heating signal, and the initial heating voltage Hint may be applied to the storage capacitor Cst. The fourth transistor T4 may adjust the heating period from the initial heating voltage Hint applied thereto. For example, a high-level initial heating voltage Hint applied via the fourth TFT T4 may increase the time duration for which the fourth TFT T4 is turned on, and a large amount of heating driving current may be applied to the heating unit, increasing the heating period. A low-level initial heating voltage Hint applied via the fourth TFT T4 may decrease the time duration for which the fourth TFT T4 is turned on, and a small amount of heating driving current may be applied to the heating unit, shortening the heating period.

The pixel circuit according to exemplary embodiments may be configured to have a structure other than that set forth in FIG. 7.

Figure 8:
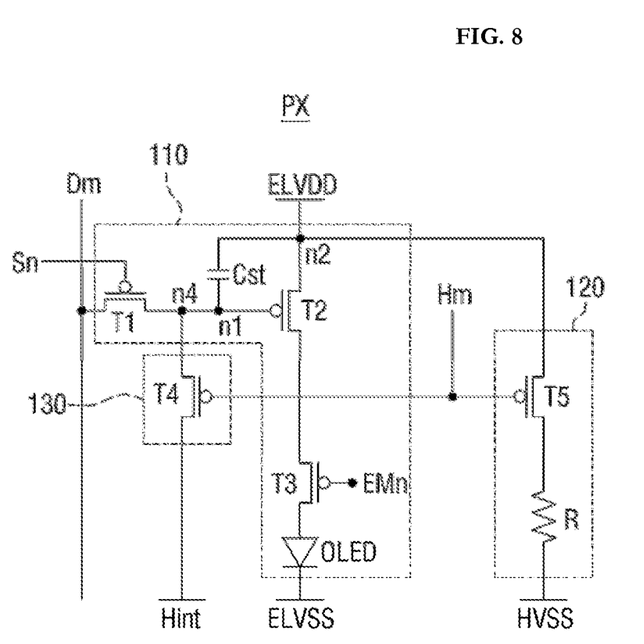
FIG. 8 is a circuit diagram of the pixel of FIG. 6, according to exemplary embodiments.

FIG. 8 is a circuit diagram of the pixel of FIG. 6, according to exemplary embodiments. The pixel PX of FIG. 8 has almost the same structure as the pixel PX of FIG. 7 except for the configuration of a heating unit 120 thereof, and thus, detailed descriptions of an organic light-emitting unit 110 and a heating time control unit 130 of the pixel PX of FIG. 8 will be omitted. More specifically, the pixel PX of FIG. 8 is the same as the pixel PX of FIG. 7 except for the connections between a fifth TFT T5 and other elements of the pixel PX. Referring to FIG. 8, the source terminal of the fifth TFT T5 may be connected to a second node n2, and the drain terminal of the fifth TFT T5 may be connected to a first end of a heating resistor R.

The first power supply voltage ELVDD may be applied to the source terminal of the fifth TFT T5 via the second node n2. According to the exemplary embodiment, the heating timing may be directly controlled compared to a case when the first power supply voltage ELVDD is applied to the source terminal of the fifth TFT T5 via a second TFT T2.

A driving method of the pixel PX of FIGS. 7 and 8 will hereinafter be described with reference to FIG. 5.

Referring to FIG. 7, the high-level selection signal and the high-level emission signal are respectively applied from the scan line Sn and the emission line EMn after an emission period, and the first TFT T1 and the third TFT T3 may be turned off. Then, in response to the heating signal, for example, a low-level heating signal applied from the heating line Hm, turning on the fourth TFT T4 and the fifth TFT T5 at the same time, and the heating driving current may be transmitted to the heating resistor R via the second TFT T2. As a result, the time duration to generate heat may be adjusted, and the heating resistor R may generate heat from the voltage difference between the first power supply voltage ELVDD and the second heating power supply voltage HVSS.

Referring to FIG. 8, the first TFT T1 and the third TFT T3 being turned off, and the heating signal, for example, a low-level heating signal applied from the heating line Hm after an emission period, turning on the fourth transistor T4 and the fifth TFT T5 at the same time. In response to turning on the fourth TFT T4, the time duration to generate heat may be adjusted by the heating driving current, and the heating resistor R may generate heat from the voltage difference between the first power supply voltage ELVDD and the second heating power supply voltage HVSS.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus, comprising:
   a display unit comprising a plurality of pixels, each of the plurality of pixels comprising:
   a light-emitting circuit comprising a light-emitting device; and
   a heating circuit adjacent to the light-emitting circuit, the heating circuit comprising a heating device; and
   a controller configured to:
   generate and output an emission signal for controlling the light-emitting circuit;
   and generate and output a heating signal for controlling the heating circuit, wherein:
   a first end of the light-emitting circuit is connected to a first power supply voltage;
   a second end of the light-emitting circuit is connected to a second power supply voltage;
   a first end of the heating circuit is connected to a first heating power supply voltage; and
   a second end of the heating circuit is connected to a second heating power supply voltage,
   wherein the heating circuit comprises a heating TFT, the heating TFT comprising:
   a gate terminal configured to receive the heating signal;

a source terminal connected to the first heating power supply voltage; and a drain terminal connected to a first end of the heating device.

2. The display apparatus of claim 1, wherein the light-emitting circuit comprises:

a first thin-film transistor (TFT) comprising:
a gate terminal configured to receive a data driving current;
a source terminal connected to the first power supply voltage; and
a drain terminal connected to the light-emitting device; and a second TFT comprising:
a gate terminal configured to receive the emission signal;
a source terminal connected to the drain terminal of the first TFT; and
a drain terminal connected to an anode of the light-emitting device, and wherein the light-emitting device comprises:
a first end connected to the drain terminal of the second TFT; and
a second end connected to the second power supply voltage.

3. The display apparatus of claim 1, wherein:
the light-emitting circuit and the heating circuit are connected to one another via a first node; and
the first power supply voltage and the first heating power supply voltage are substantially identical to one another.

4. The display apparatus of claim 1, wherein:
the light-emitting circuit and the heating circuit are connected to one another via a second node; and
the second power supply voltage and the second heating power supply voltage are substantially identical to one another.

5. The display apparatus of claim 1, wherein:
the light-emitting circuit and the heating circuit are connected to one another via a third node; and
the first power supply voltage and the first heating power supply voltage are substantially identical to one another.

6. The display apparatus of claim 1, wherein each of the plurality of pixels further comprises a heating time control circuit configured to control a heating time of the heating device.

7. The display apparatus of claim 6, wherein the heating time control circuit is adjacent to the light-emitting circuit.

8. The display apparatus of claim 7, wherein the heating time control circuit comprises a fourth TFT, the fourth TFT comprising:
a gate terminal configured to receive the heating signal;
a source terminal configured to receive a heating voltage; and
a drain terminal connected to the light-emitting circuit via a fourth node.

9. The display apparatus of claim 8, wherein:
the heating time control circuit is configured to increase a heating period of the heating device in response to a first-level of the first heating voltage; and
the heating time control circuit is configured to decrease a heating period of the heating device in response to a second-level of the first heating voltage.

10. The display apparatus of claim 1, wherein the controller is further configured to apply the emission signal and the heating signal to the light-emitting circuit and the heating circuit, respectively, at different times.

11. A pixel of a display apparatus comprising a pixel circuit, the pixel circuit comprising:
a light-emitting unit comprising a light-emitting device configured to emit light in response to an emission signal; and
a heating unit adjacent to the light-emitting unit, the heating unit being configured to generate heat in response to a heating signal, wherein:
the emission signal comprises a low-level emission signal and a high-level emission signal;
the heating signal comprises a low-level heating signal and a high-level heating signal; and
an application time of the low-level emission signal differs from an application time of the low-level heating signal, and
wherein the heating unit comprises a heating device and a heating TFT, the heating TFT comprising:
a gate terminal configured to receive the heating signal;
a source terminal connected to a first heating power supply voltage; and
a drain terminal connected to a first end of the heating device.

12. The pixel of claim 11, wherein the light-emitting unit is configured to receive the low-level emission signal in response to the high-level heating signal being applied to the heating unit.

13. The pixel of claim 12, wherein the light-emitting unit is configured to receive the high-level emission signal in response to the low-level heating signal being applied to the heating unit.

14. The pixel of claim 11, wherein:
a first end of the light-emitting unit is connected to a first power supply voltage; and
a second end of the light-emitting unit is connected to a second power supply voltage.

15. The pixel of claim 14, wherein:
a first end of the heating unit is connected to the first heating power supply voltage; and
a second end of the heating unit is connected to a second heating power supply voltage.

16. The pixel of claim 15, wherein the first power supply voltage and the first heating power supply voltage are substantially identical to one another.

17. The pixel of claim 15, wherein the second power supply voltage and the second heating power supply voltage are substantially identical to one another.

18. The pixel of claim 11, further comprising:
a heating time control circuit adjacent to the light-emitting unit,
wherein the heating time control circuit is configured to:
receive an initial heating voltage; and
control a heating time of the heating device in response to the initial heating voltage.

19. The pixel of claim 18, wherein:
the heating time control circuit is configured to increase a heating time of the heating device in response to a first-level of the heating voltage; and
the heating time control circuit is configured to decrease a heating time of the heating device in response to a second-level of the heating voltage.

* * * * *